United States Patent
Chou et al.

(10) Patent No.: US 6,793,797 B2
(45) Date of Patent: Sep. 21, 2004

(54) METHOD FOR INTEGRATING AN ELECTRODEPOSITION AND ELECTRO-MECHANICAL POLISHING PROCESS

(75) Inventors: Shih-Wei Chou, Taipei (TW); Ming-Hsing Tsai, Taipei (TW); Winston Shue, Hsinchu (TW); Mong-Song Liang, Hsin-Chu (TW)

(73) Assignee: Taiwan SEmiconductor Manufacturing Co., Ltd, Hsin Chu (TW)

( * ) Notice: Subject to any disclaimer, the term of this patent is extended or adjusted under 35 U.S.C. 154(b) by 146 days.

(21) Appl. No.: 10/106,733

(22) Filed: Mar. 26, 2002

(65) Prior Publication Data
US 2003/0183530 A1 Oct. 2, 2003

(51) Int. Cl.⁷ .................................. C25D 5/18
(52) U.S. Cl. ................ 205/103; 205/123; 205/157; 205/640; 205/646; 205/87
(58) Field of Search ................. 205/103, 87, 123, 205/157, 640, 646

(56) References Cited
U.S. PATENT DOCUMENTS 6,355,153 B1 * 3/2002 Uzoh et al. ............... 205/87
6,402,925 B2 * 6/2002 Talieh ..................... 205/222
2003/0155255 A1 * 8/2003 Yahalom et al. .......... 205/640

FOREIGN PATENT DOCUMENTS

JP        2002-158328       * 6/2000    ........... B24B/37/00

* cited by examiner

Primary Examiner—Robert R. Koehler
(74) Attorney, Agent, or Firm—Tung & Associates

(57) ABSTRACT

A method for alternately electrodepositing and electro-mechanically polishing to selectively fill a semiconductor feature with metal including a) providing an anode assembly and a semiconductor wafer disposed in spaced apart relation including an electrolyte there between the semiconductor wafer including a process surface including anisotropically etched features arranged for an electrodeposition process; b) applying an electric potential across the anode assembly and the semiconductor wafer to induce an electrolyte flow at a first current density to electrodeposit a metal filling portion onto the process surface; c) reversing the electric potential to reverse the electrolyte flow at a second current density to electropolish the process surface in an electropolishing process; and, d) sequentially repeating the steps b and c to electrodeposit at least a second metal filling portion to substantially fill the anisotropically etched features.

18 Claims, 2 Drawing Sheets

METHOD FOR INTEGRATING AN ELECTRODEPOSITION AND ELECTRO-MECHANICAL POLISHING PROCESS

FIELD OF THE INVENTION

This invention generally relates to metallic electrodeposition and more particularly to a method for integrating an electrodeposition and electro-mechanical polishing process in semiconductor manufacturing to selectively fill with metal anisotropically etched semiconductor features.

BACKGROUND OF THE INVENTION

Copper and copper alloys have become the metal of choice for filling sub-micron, high aspect ratio interconnect features on semiconductor substrates. Copper and its alloys have lower resistivity and higher electromigration resistance compared to other metals such as, for example, aluminum. These characteristics are critical for achieving higher current densities increased device speed.

As circuit densities increase, the widths of vias, contacts, metal interconnect lines, and other features, decrease to sub-micron dimensions, whereas the thickness of the dielectric layers, through the use low-k (low dielectric constant) materials, has remained substantially constant. Consequently, the aspect ratios for the features, i.e., their height divided by width, has increased thereby creating additional challenges in adequately filling the sub-micron features with, for example, copper metal. Many traditional deposition processes such as chemical vapor deposition (CVD) have difficulty filling increasingly high aspect ratio features, for example, where the aspect ratio exceeds 2:1, and particularly where it exceeds 4:1.

As a result of these process limitations, electroplating or electrodeposition is now a preferable method for filling metal interconnects structures such as via openings and trench line openings on semiconductor devices. Typically, electroplating uses an electrolyte including positively charged ions of deposition material, for example metal ions, in contact with a negatively charged substrate (cathode) having a source of electrons to deposit (plate out) the metal ions onto the charged substrate, for example, a semiconductor wafer. A thin metal layer (seed layer) is first deposited on the semiconductor wafer to form a liner in high aspect ratio anisotropically etched features to provide a continuous electrical path across the surfaces. An electrical current is supplied to the seed layer whereby the semiconductor wafer surface including etched features are electroplated with an appropriate metal, for example, aluminum or copper, to fill the features.

One exemplary process for forming a series of interconnected multiple layers, for example, is a damascene or dual damascene process. Although there are several different manufacturing methods for manufacturing damascene structures, all such methods employ a series of photolithographic masking and etching steps, typically by a reactive ion etch (RIE). In the typical multilayer semiconductor manufacturing process, for example, a series insulating layers are deposited to include a series of interconnecting metallization structures such as vias and metal line interconnects to electrically interconnect areas within the multilayer device and contact layers to interconnect the various devices on the chip surface. In most devices, pluralities of vias are separated from one another along the semiconductor wafer and selectively interconnect conductive regions between layers of a multilayer device. Metal interconnect lines typically serve to selectively interconnect conductive regions within a layer of a multilayer device. Vias and metal interconnect lines are selectively interconnected in order to form the necessary electrical connections.

In filling the via openings and trench line openings with metal, for example, copper, electroplating is a preferable method to achieve superior step coverage of sub-micron etched features. The method generally includes first depositing a barrier layer over the etched opening surfaces, such as via openings and trench line openings, depositing a metal seed layer, for example copper, over the barrier layer, and then electroplating a metal, for example copper, over the seed layer to fill the etched features to form conductive vias and trench lines. Finally, the electro deposited layer and the dielectric layers are planarized, for example, by chemical mechanical polishing (CMP), to define a conductive interconnect feature.

Metal electroplating (electrodeposition) in general is a well-known art and can be achieved by a variety of techniques. Common designs of cells for electroplating a metal on semiconductor wafers involve positioning the plating surface of the semiconductor wafer within an electrolyte solution including an anode with the electrolyte impinging perpendicularly on the plating surface. The plating surface is in electrical communication with an electrical power source thereby forming the cathode of the plating system such that ions in the plating solution deposit on the conductive portion of the plating surface, for example a semiconductor wafer surface.

More recent electroplating processes use self contained assemblies where the anode and semiconductor wafer are in close proximity to carry out both electroplating and electropolishing. Typically the semiconductor wafer surface is spaced apart from the anode in the electroplating solution during electrodeposition and contacts the anode during the electropolishing process where the semiconductor wafer becomes the anode and the anode assembly acts as a cathode.

A recurring problem in copper electrodeposition process is that excess copper must be deposited on the wafer process surface during electrodeposition which conformally deposits metal to fill anisotropically etched semiconductor features. The excess copper is necessary to allow for adequate planarization to be achieved in a subsequent chemical mechanical polishing (CMP) process to prepare the wafer for manufacturing subsequent semiconductor device levels. Typically, the excess copper layer is removed following electrodeposition according to chemical mechanical polishing (CMP) which generally includes an abrasive polishing solution and a polishing pad applied with a significant downforce to the semiconductor wafer surface. The copper layer is typically deposited over an insulating dielectric layer in which the semiconductor features are anisotropically etched. With the increasing use of low dielectric constant materials (e.g., <3.5) which typically have a lower strength and poor adhesion to copper due to, among other reasons, an increased level of porosity, copper CMP may cause peeling of the electrodeposited copper layer thereby reducing manufacturing yield. In addition, the copper CMP process increases a throughput time and involves the use of costly CMP apparatus and polishing chemicals. Moreover, the copper CMP process may induce other wafer defects including preferential polishing of copper semiconductor features referred to as dishing and erosion.

One approach to reduce the necessity of lengthened copper CMP polishing times has been to electropolish the semiconductor wafer following an electrodeposition process to reduce the thickness of the excess copper layer. This approach creates the difficulty that electropolishing which conformally removes the excess copper does not achieve the desired degree of planarization necessary for subsequent processing steps.

These and other shortcomings demonstrate a need in the semiconductor processing art to develop a method for electrodeposition whereby the necessity for a subsequent CMP planarization step is avoided to increase a semiconductor wafer throughput and yield.

It is therefore an object of the invention to provide a method for electrodeposition whereby the necessity for a subsequent CMP planarization step is avoided to increase a semiconductor wafer throughput and yield while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for alternately electrodepositing and electro-mechanically polishing to selectively fill a semiconductor feature with metal.

In a first embodiment, the method includes a) providing an anode assembly and a semiconductor wafer disposed in spaced apart relation including an electrolyte there between the semiconductor wafer including a process surface including anisotropically etched features arranged for an electrodeposition process; b) applying an electric potential across the anode assembly and the semiconductor wafer to induce an electrolyte flow at a first current density to electrodeposit a metal filling portion onto the process surface; c) reversing the electric potential to reverse the electrolyte flow at a second current density to electropolish the process surface in an electropolishing process; and, d) sequentially repeating the steps b and c to electrodeposit at least a second metal filling portion to substantially fill the anisotropically etched features.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In the method and apparatus according to the present invention, the invention is explained by reference to electrodeposition of copper to substantially fill an anisotropically etched feature, for example, a dual damascene structure. By the term 'substantially' is meant at least about 90 percent of the relevant 100 percent value. It will be appreciated, however, that the method of the present invention may be advantageously applied to the electrodeposition (electroplating) of any metal onto an electrode surface where a an electrodeposition method is used. It will further be appreciated that although the method of the present invention is explained by reference to an exemplary electrodeposition apparatus that the method may be applied to the use of any electrodeposition apparatus where an electrodeposition and electropolishing process including a mechanical polishing process applied for at least a portion of the electropolishing process may be alternately performed to selectively fill an anisotropically etched semiconductor feature with an electrodeposited metal. It will be appreciated that the term copper as used herein refers to copper and copper alloys.

In one embodiment of the invention, an electrodeposition process and electropolishing process are alternately performed to controllably complete a metal filling electrodeposition process. For example, a first electrodeposition process is performed to electrodeposit a metal, for example copper, to fill a portion of anisotropically etched semiconductor features, for example, a dual damascene structure. In one embodiment, the first portion includes between about 10 percent and 100 percent of the feature volume. The electropolishing process is then performed with optional simultaneous mechanical polishing for at least a portion of the electropolishing process to remove a portion of the metal. At least a second electrodeposition process and electropolishing process is carried Out to incrementally substantially fill the anisotropically etched feature with metal.

Figure 1A:
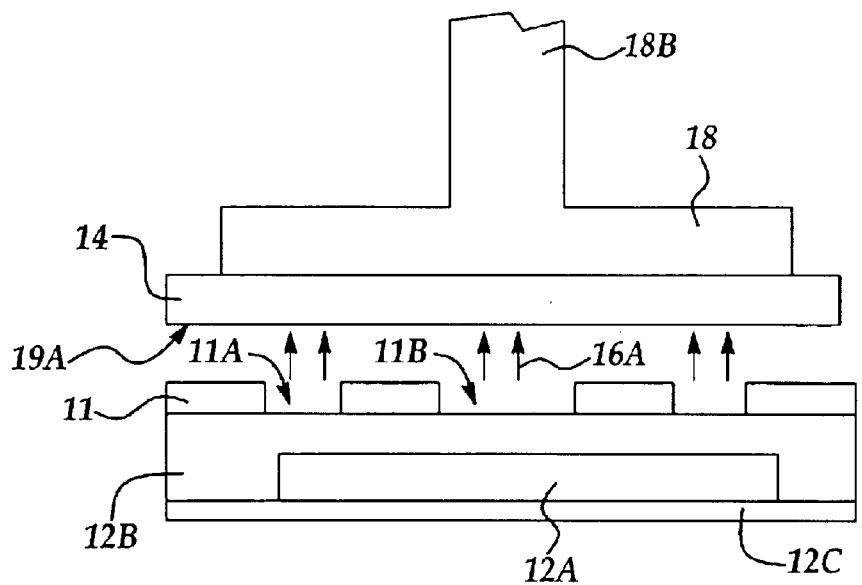
FIGS. 1A and 1B are conceptual cross sectional side view representations of an electrode assembly arrangement and electrolyte current flow during electrodeposition and electro-mechanical polishing steps according to the present invention.

For example, referring to FIG. 1A is shown a schematic representation (not showing the electrolyte container) of the relationship of an exemplary electrodeposition anode assembly 12 and a semiconductor wafer 14 for carrying out the electrodeposition and electropolishing process. The anode assembly 12 and semiconductor wafer 14 are held in spaced apart relation during the electrodeposition portion of the process. The anode assembly 12, includes an anode 12A, for example, formed of copper or an alloy thereof for supplying copper ions for copper electroplating. The anode 12A is for example, surrounded by a titanium top plate, 12B and a titanium bottom plate 12C including openings (not shown) to allow copper ions to pass through. A polishing pad e.g., 11 for rotatable mechanical polishing covers the titanium top plate 12B for mechanically abrading the semiconductor surface during an electropolishing step as explained below and includes openings e.g., 11A, 11B for directing an electrolytic current flow including copper ions indicated by directional arrows e.g., 16A. There are a wide variety of suitable commercially available polishing pads optimized for particular metal surfaces, such as those used in CMP processes. Preferably, the semiconductor wafer 14 is held by vacuum chuck 18 attached to shaft 18B to position the semiconductor wafer is spaced apart relation to the anode assembly 12 during electrodeposition.

During the electrodeposition process copper ions are carried according to the electrolyte current flow to the semiconductor wafer surface 14A for electroplating. An electrical potential is created between the anode assembly 12 and the semiconductor wafer 14 (cathode) by a power source (not shown) in electrical communication with the semiconductor wafer 14 (cathode) and anode assembly 12. Preferably, the power source may be controlled to deliver a predetermined current density for a predetermined period of time according to a predetermined waveform, for example including pulsed power and alternating current waveforms by typical methods known in the art.

In operation, the anode assembly 12 and semiconductor wafer surface 14A are positioned so that an electrolyte carries positively charged copper ions, supplied from the anode, to the negatively charged semiconductor wafer 14 (cathode) where the positively charged copper ions are plated out by a reduction reaction onto the semiconductor wafer surface 14A. The electrolyte solution includes, for example, copper sulfate and may be an acidic or basic solution including complexing agents as is known in the art. In a typical electrodeposition process, also referred to as electro-chemical metal deposition (ECD or ECMD), the current may range from a current density of about 1 to about 100 mA/cm$^2$.

Figure 1B:
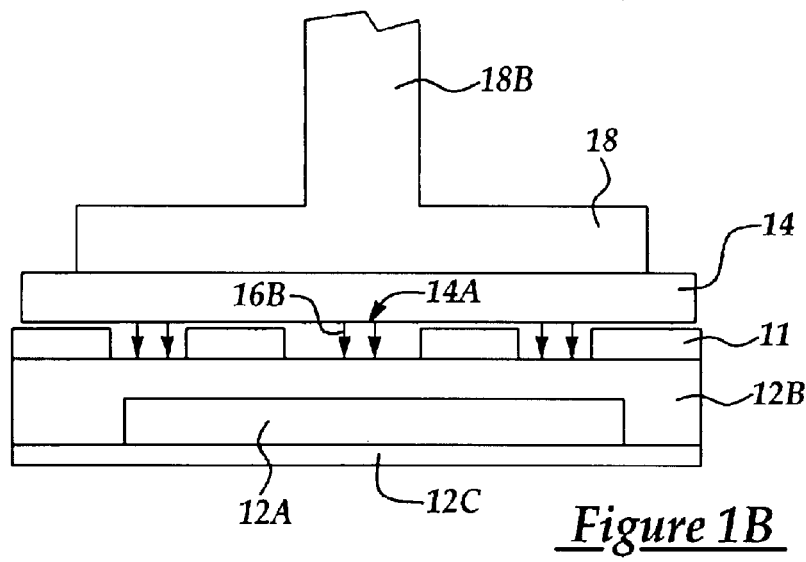

Referring to FIG. 1B, according to the present invention, following a first electrodeposition process to fill a portion of anisotropically etched semiconductor features with a metal to produce a filled metal portion, an electropolishing process optionally including simultaneous mechanical polishing of the wafer process surface 14A is carried out. The semiconductor wafer process surface 14A contacts the anode assembly including polishing pad surface 11 as shown in FIG. 2B. For example, the semiconductor wafer may be held by vacuum chuck 18 which is controllably rotated by rotating shaft 18B to produce an abrasive polishing action by rotatably contacting polishing pad 11.

In one embodiment, the abrasive polishing action is applied simultaneously for at least a portion of the electropolishing process where the electrolyte current flow is reversed as indicated by directional arrows e.g., 16B. During reversed current flow the semiconductor wafer is the anode and the anode assembly now acts as a cathode. When mechanical polishing action is applied during the electropolishing process, copper metal is removed from an electrodeposited copper layer at the wafer process surface according to both an anodic electrochemical dissolution and abrasive polishing action. Preferably, the electropolishing process includes simultaneous mechanical polishing (electromechanical polishing) being carried out for at least a portion of the electropolishing process. The electro-mechanical polishing process is preferably carried out for a sufficient period of time to substantially remove an electrodeposited copper layer overlying a barrier/adhesion layer at the wafer process surface.

For example, a lower or higher reversed current density is applied compared to an electrodeposition current density, for example, about 1 to about 100 mA/cm$^2$ during the electromechanical polishing process. It will be appreciated that the overall current density will depend on processing time. It will also be appreciated that an instantaneously determined reversed current density (mA/cm$^2$-sec) may be higher or lower depending on the desired copper removal rate. For example a lower instantaneous current density may be applied in order to better control conformal copper removal while allowing planarization of the copper layer according to mechanical polishing. In another embodiment, a higher instantaneous reversed current density compared to an electrodeposition current density is applied. It will be appreciated that whether the overall reversed current density is higher or lower compared to the electrodeposition current density will depend on processing time. It will be appreciated that various combinations of a mechanical polishing rate and electropolishing rate may be varied by adjusting the various process parameters. In addition, it will be appreciated that different overall copper removal rates may be preferable for polishing different features and feature densities. Further, it will be appreciated that the copper removal rate may be different, for example greater than the copper removal rate due to either mechanical or electropolishing alone. For example, the overall copper removal rate is preferably adjusted to be about 100 Angstroms/min to about 500 Angstroms/min. It will be further appreciated that both the normal current mode (electrodeposition) and the reversed current mode (electropolishing) according to the present invention may be operated in a continuous manner with continuous applied power or a pulsed manner according to pulsed applied power. For example, preferably, power pulses supplying a current density are applied for about period of about 10 to about 500 milliseconds.

In another embodiment, the mechanical polishing action is stopped prior to completion of substantial removal of the copper layer overlying the copper seed layer and the electropolishing process continued for a period of time to substantially remove the copper layer overlying the copper barrier layer. This embodiment may be advantageously used to provide a smoother surface for the next processing step, and to guard against overpolishing.

Following the electropolishing and optional simultaneous mechanical polishing step (electromechanical polishing), at least a second electrodeposition process is carried out followed by at least a second electro polishing step with an optional electro-mechanical polishing step to complete a second process cycle according to the present invention. In one embodiment, the electrodeposition processes subsequent to the first electrodeposition process incrementally increases the filled metal portion of the semiconductor features. In another embodiment, the relative current densities used in the electrodeposition process and the electromechanical polishing step are incrementally increased in cycles subsequent to the first cycle. For example, the current densities in each subsequent cycle are increased for example, by about 10 to about 100 percent compared to the previous cycle. It will be appreciated that the electrodeposition and electro-mechanical polishing steps to complete a cycle may be repeated to include more than two cycles to achieve completely filled metal features having a planarized surface without a copper overlayer remaining on the semiconductor wafer surface. For example, about three cycles should be sufficient to suitably completely fill with copper a semiconductor feature.

Figure 3A:
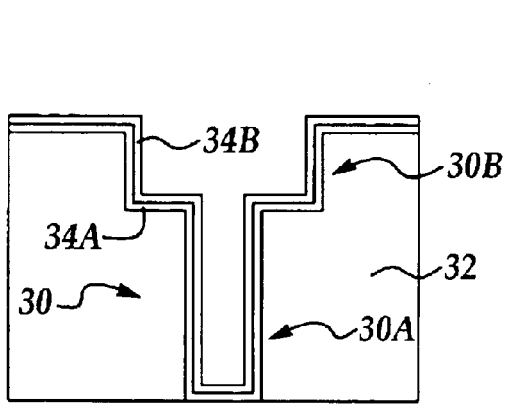
FIGS. 3A–3E are side view representations of a portion of a semiconductor wafer showing an exemplary dual damascene structure filled with metal in an electrodeposition process following alternate electrodeposition and electro-mechanical polishing steps according to the present invention.

In an exemplary process, for example, referring to FIG. 3A, is shown a portion of a semiconductor wafer including an anisotropically etched dual damascene structure 30 having a via portion 30A and an overlying trench line portion 30B. While there are several ways to form a dual damascene structure, one approach involves at least two photolithographic patterning and anisotropic etching steps to first form a via opening e.g., 30A, followed by a similar process to form an overlying trench line opening 30B. The dual damascene structure 30 is formed in an insulating layer 32, for example a low dielectric constant material, for example, carbon doped oxide, formed by plasma enhanced CVD (PECVD). A barrier/adhesion layer 34A of for example, TaN nitride, is conformally deposited to include covering the sidewalls and bottom portion of the anisotropically etched via opening 30A and sidewalls of the trench opening 30B. The barrier/adhesion layer 34A serves the purpose of preventing copper diffusion into the surrounding insulating layer 32. Following barrier/adhesion layer 34A deposition, a seed layer 34B of copper or copper alloy is conformally deposited over the barrier layer 34A by, for example PVD or CVD. The copper seed layer 34B is preferably conformally deposited to form a continuous layer to form a conductive surface for a subsequent electrodeposition process whereby an electrical potential is applied to the seed layer by cathode contacts contacting, for example, the outer peripheral edges of the semiconductor wafer.

Figure 2:
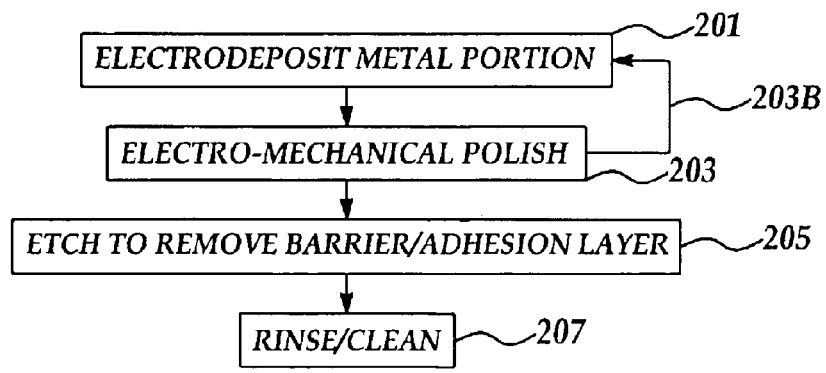
FIG. 2 is a process flow diagram including several embodiments of the present invention.
Figure 3B:
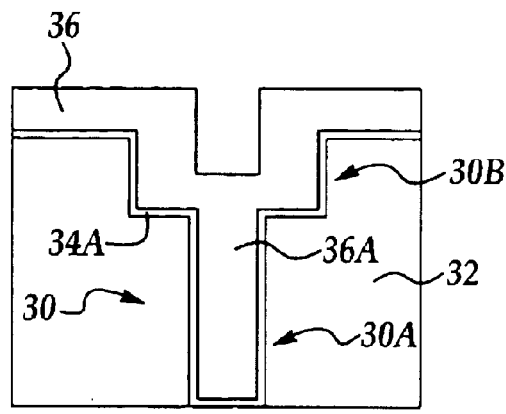

Referring to FIG. 3B, a cross sectional representation of a portion of a semiconductor device is shown including the dual damascene structure 30 according to a first step of the present invention. According to an embodiment of the present invention a first electrodeposition process 201 as shown in process flow diagram in FIG. 2 is performed to electrodeposit a copper fill portion 36A (seed layer not shown), to fill a first portion of the dual damascene structure as shown in FIG. 3B. Preferably, the first portion includes copper electrodeposited to fill between about 10 percent and 100 percent of the volume of the feature to define a copper fill portion 36A.

Figure 3C:
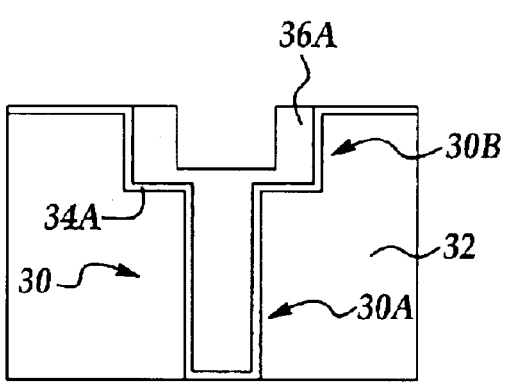

Referring to FIG. 3C and process flow diagram in FIG. 2, following the first electrodeposition process an electropolishing process according to process 203 including simultaneous mechanical polishing (electromechanical polishing) for at least a portion of the electropolishing process is carried out to substantially remove the copper layer 36 at the wafer process surface overlying the barrier/adhesion layer 34A to complete a first process cycle. As conceptually shown in FIG. 3C, a portion of the electrodeposited copper fill portion 36A within the trench line portion 30B is conformally removed.

Figure 3D:
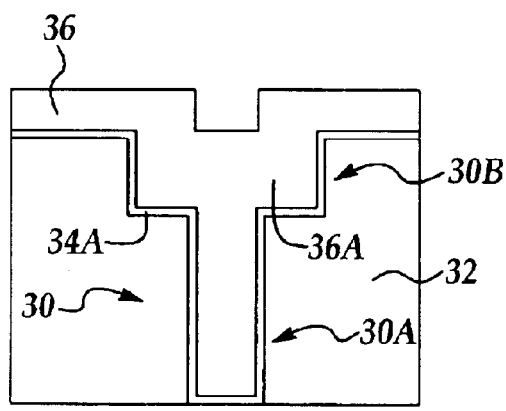

Referring to FIG. 3D and process flow diagram in FIG. 2, at least a second cycle as indicated by process direction arrow 203B to include at least a second electrodeposition process is carried out to electrodeposit copper fill portion 36A, preferably incrementally increasing a copper fill volume of the copper filled portion 36A of the dual damascene structure compared to the first electrodeposition process.

Figure 3E:
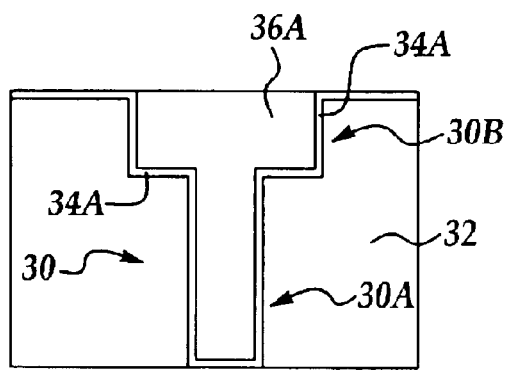

Referring to FIG. 3E and process flow diagram in FIG. 2, at least a second electropolishing step including electromechanical polishing in process 203 is carried out to substantially remove the copper layer 36 at the wafer process surface overlying the barrier/adhesion layer 34A to complete a second process cycle. In practice, for example, the portion of the electrodeposited copper fill portion 36A within the trench line portion 30B is incrementally removed to a lesser extent after a process cycle compared to a previous cycle to incrementally increase a copper fill portion to completely fill with copper the dual damascene structure 30 without having a copper layer, e.g., 36 overlying the barrier/adhesion layer 34A at the surface.

Preferably, process 201 and process 203 are repeated at least once to complete copper filling of the dual damascene structure without an overlying copper layer 36 remaining, thus obviating the need for a CMP step. Following completion of copper filling of the dual damascene structure, a conventional dry plasma etching or isotropic wet etching process 205 to remove the barrier adhesion layer 34A and a conventional wet cleaning process 207 are preferably carried out to complete a semiconductor device level.

Thus, according to the electrodeposition and electromechanical process method of present invention, the necessity of a CMP process step following electrodeposition of copper to fill an anisotropically etched semiconductor feature is avoided thereby reducing CMP induced defects including peeling, dishing, and erosion while increasing a wafer yield and throughput.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for alternately electrodepositing and electromechanically polishing to selectively fill a semiconductor feature opening with metal comprising the steps of:
   a. providing a semiconductor wafer process surface comprising etched openings the process surface covered with a continuous metal seed layer for applying an electric potential in an electrodeposition and electropolishing process;
   b. applying the electric potential in an electrodeposition process to electrodeposit a metal filling portion onto the process surface;
   c. reversing the electric potential in an electropolishing process to electropolish white simultaneously mechanically polishing the process surface to remove a portion of the metal filling portion; and,
   d. sequentially repeating the steps b and c at least once to substantially fill the etched openings with the metal while substantially and incrementally removing a smaller portion of the metal filling portion in the electropolishing and mechanical polishing process.

2. The method of claim 1, wherein the metal filling portion is one of copper, aluminum, and tungsten.

3. The method of claim 1, wherein the step of sequentially repeating includes incrementally filling the etched openings with the metal.

4. The method of claim 1, wherein the electrodeposition and electropolishing process have a current density from about 1 mA/cm$^2$ to about 100 mA/cm$^2$.

5. The method of claim 1, further comprising the step of removing a barrier/adhesion layer remaining at the process surface according to a method selected from the group consisting of a dry plasma etching and a wet etching process.

6. The method of claim 1, wherein the step of sequentially repeating comprises one of incrementally increasing and incrementally decreasing an instantaneously determined current density in the electropolishing process.

7. A method for alternately electrodepositing and electromechanically polishing a semiconductor wafer process surface to fill an etched opening with metal to avoid a subsequent CMP process comprising the steps of:
   a. providing an anode assembly and a semiconductor wafer arranged for an electrodeposition process including an electrolyte there between the semiconductor wafer having a process surface including etched openings the process surface covered with a continuous metal seed layer for applying an electric potential;
   b. applying the electric potential to induce an electrolyte flow at a first current density to electrodeposit a metal over the continuous metal seed layer to fill a portion of the etched openings with the metal;
   c. reversing the electric potential to reverse the electrolyte flow at a second current density to electropolish the process surface;
   d. abrasively contacting the process surface with a polishing pad during the electropolishing process to remove a portion of the metal; and,
   e. sequentially repeating the steps b, c, and d, to substantially fill the etched openings with the metal leaving the process surface substantially free of the metal, said step further comprises one of incrementally increasing and incrementally decreasing an instantaneously determined second current density with respect to the first current density.

8. The method of claim 7, wherein the metal is one of copper, aluminum, and tungsten.

9. The method of claim 7, wherein the portion is from about 10 percent to about 100 percent of the volume of the etched openings.

10. The method of claim 9, wherein the step of sequentially repeating includes incrementally filling the etched openings following each process cycle.

11. The method of claim 7, wherein the step of sequentially repeating includes incrementally increasing the first and second current density.

12. The method of claim 7, wherein the first and second current density comprise a current density from about 1 mA/cm$^2$ to about 100 mA/cm$^2$.

13. The method of claim 1, wherein the electric potential comprises a waveform is selected from the group consisting of a pulsed power and alternating current waveform.

14. The method of claim 7, wherein the electric potential comprises a waveform is selected from the group consisting of a pulsed power and alternating current waveform.

15. The method of claim 1, wherein the openings are selected from the group consisting of a damascene and a dual damascene.

16. The method of claim 7, wherein the openings are selected from the group consisting of a damascene and a dual damascene.

17. The method of claim 7, further comprising the step of removing a barrier/adhesion layer remaining at the process surface according to a method selected from the group consisting of a dry plasma etching and a wet etching process.

18. The method of claim 7, wherein the step of sequentially repeating comprises incrementally removing a smaller portion of the metal in the electropolishing and mechanical polishing process.

* * * * *